US009747385B2

(12) United States Patent
Hao

(10) Patent No.: US 9,747,385 B2
(45) Date of Patent: Aug. 29, 2017

(54) COMPRESSION OF CASCADING STYLE SHEET FILES

(71) Applicant: Alibaba Group Holding Limited, George Town, Grand Cayman (KY)

(72) Inventor: Lixin Hao, Hangzhou (CN)

(73) Assignee: ALIBABA GROUP HOLDING LIMITED, George Town (KY)

( * ) Notice: Subject to any disclaimer, the term of this patent is extended or adjusted under 35 U.S.C. 154(b) by 101 days.

(21) Appl. No.: 14/881,066

(22) Filed: Oct. 12, 2015

(65) Prior Publication Data
US 2016/0110324 A1 Apr. 21, 2016

(30) Foreign Application Priority Data
Oct. 15, 2014 (CN) .......................... 2014 1 0545554

(51) Int. Cl.
*G06F 17/30* (2006.01)
*G06F 17/22* (2006.01)
*H03M 7/30* (2006.01)

(52) U.S. Cl.
CPC .... *G06F 17/30896* (2013.01); *G06F 17/2252* (2013.01); *H03M 7/30* (2013.01)

(58) Field of Classification Search
CPC . G06F 17/2252; G06F 17/30896; H03M 7/30
USPC ................... 715/234, 235, 236, 242
See application file for complete search history.

(56) References Cited

U.S. PATENT DOCUMENTS

| 7,299,411 | B2* | 11/2007 | Blair ................... G06F 17/211 |
| | | | 348/E7.073 |
| 7,562,070 | B2* | 7/2009 | Tchaitchian ........ G06F 17/2247 |
| 7,769,773 | B1* | 8/2010 | Doubek ............ G06F 17/30914 |
| | | | 707/769 |
| 7,827,481 | B1* | 11/2010 | Greenfield ................ G06F 8/24 |
| | | | 715/236 |
| 2004/0133855 | A1 | 7/2004 | Blair et al. |
| 2008/0168345 | A1* | 7/2008 | Becker ............. G06F 17/30896 |
| | | | 715/242 |
| 2009/0217145 | A1 | 8/2009 | Watson |
| 2011/0314091 | A1* | 12/2011 | Podjarny ........... G06F 17/30905 |
| | | | 709/203 |
| 2013/0024763 | A1 | 1/2013 | Nemati et al. |
| 2013/0159839 | A1 | 6/2013 | Joffray et al. |
| 2013/0174021 | A1 | 7/2013 | Buchwald et al. |
| 2014/0095579 | A1 | 4/2014 | Shah et al. |
| 2014/0136956 | A1 | 5/2014 | Wong et al. |
| 2014/0149844 | A1* | 5/2014 | Podjarny ............. G06F 17/2247 |
| | | | 715/234 |

(Continued)

*Primary Examiner* — Andrew Dyer
(74) *Attorney, Agent, or Firm* — Shun Yao; Park, Vaughan, Fleming & Dowler LLP

(57) ABSTRACT

One embodiment of the present invention provides a system for facilitating compression of a Cascading Style Sheet (CSS) file. During operation, the system stores the CSS file in a local storage device and identifies a merge parameter in the CSS file. The merge parameter can be one of: a repeated selector, a repeated property in a selector, and a same value of a property in different selectors. The system then determines whether a merge condition is satisfied for the merge parameter and merges the merge parameter in the CSS file to obtain a compressed merge parameter. The merge condition indicates whether merging of the merge parameter is consistent with original style in the CSS file.

19 Claims, 8 Drawing Sheets

(56) References Cited

U.S. PATENT DOCUMENTS

2014/0214779 A1 7/2014 Francis
2014/0289612 A1 9/2014 Mi

* cited by examiner

COMPRESSION OF CASCADING STYLE SHEET FILES

RELATED APPLICATION

Under 35 U.S.C. 119, this application claims the benefit and right of priority of Chinese Patent Application No. 201410545554.X, filed 15 Oct. 2014.

BACKGROUND

Field

The present application relates to the field of computer technologies, and in particular, to a method and system for data compression for network communication.

Related Art

With the advancement of the computer and network technologies, various operations performed by users from different applications lead to extensive access to web services. For example, multiple users may concurrently shop on an e-commerce website via different applications, such as mobile applications running on different platforms as well as web-interfaces running on different browsers in different operating systems. A server hosting the web services presents the corresponding shopping web page to different users, thereby facilitating the e-commerce service.

However, different applications concurrently accessing the system can cause an increasing number of user activities, consequently, an increasing amount of web pages are accessed from the server. A large number OF these web pages can be represented using a Cascading Style Sheet (CSS). A CSS file is typically sent over a network along with a web page to provide the presentation style for the web page for a browser in a client device. The CSS file is typically in a text format. If a CSS file is compressed, the size of the CSS file becomes smaller. As a result, the compressed CSS file can be transmitted over the network more efficiently.

Although a number of methods are available for CSS file compression, some problems still remain in extensive compression of CSS files.

SUMMARY

One embodiment of the present invention provides a system for facilitating compression of a Cascading Style Sheet (CSS) file. During operation, the system stores the CSS file in a local storage device and identifies a merge parameter in the CSS file. The merge parameter can be one of: a repeated selector, a repeated property in a selector, and a same value of a property in different selectors. The system then determines whether a merge condition is satisfied for the merge parameter and merges the merge parameter in the CSS file to obtain a compressed merge parameter. The merge condition indicates whether merging of the merge parameter is consistent with original style in the CSS file.

In a variation of this embodiment, the system determines whether the compressed merge parameter is valid based on a length of the compressed merge parameter.

In a variation of this embodiment, the system determines whether a merge condition is satisfied by determining whether a first selector and a second selector are adjacent. If the first and second selectors are not adjacent, the system determines whether a third selector between the first and second selectors includes a property included in the first and second selectors.

In a further variation, the system further determines whether a merge condition is satisfied by determining whether the property has one or more of: (i) a same value in the first, second, and third selectors, and (ii) different priorities in the first, second, and third selectors In a variation of this embodiment, the system determines whether a merge condition is satisfied by determining that (i) a latter value of a property of the merge parameter overwrites a former value of the property, and the latter value has a equal or higher priority, or (ii) a former value of the property overwrites a latter value of the property and the former value has a higher priority.

In a variation of this embodiment, the system merges the merge parameter by removing a second value of a property for a selector. The second value can (i) appear before a first value, (ii) have a lower priority than the first value, or (iii) have a overwriting relationship with the first value.

In a variation of this embodiment, the system represents selectors of the CSS file and corresponding properties in a table, and determines a common area in the table for a respective property.

In a further variation, the system identifies a current maximum common area in the table for a property, extracts the property as a common factor, and merges the common factor across a respective selector comprising the property.

In a variation of this embodiment, the system generates a compressed CSS file based on a plurality of compressed merge parameters.

In a variation of this embodiment, the system prepares the CSS file for compression by organizing properties of all selectors in the CSS file in an alphabetic order.

BRIEF DESCRIPTION OF THE FIGURES

The accompanying drawings herein, which are incorporated herein and constitute a part of the specification, illustrate several exemplary embodiments of the present application and together with the description, serve to illustrate the present application, construing no limitation to the present application. In the drawings.

DETAILED DESCRIPTION

Embodiments of the present invention solve the problem of efficiently compressing a CSS file by merging repeated selectors, and repeated properties and values in the CSS file while ensuring compression integrity. In this way, the enhanced compression of the CSS file results in a smaller size, which is conveniently transmitted over a network.

With existing technologies, compressing the CSS file removes the margins, annotations, and repeated characters in the CSS file to reduce the size of the file. Furthermore, some compressors may also remove invalid characters. However, such compression does not significantly reduce redundancy within and across the selectors of the CSS file. Particularly, preprocessing the CSS file can generate a large quantity of redundant CSS code, which may not be directly compressed. Transmitting such a CSS file across a network becomes inefficient.

To solve this problem, embodiments of the present invention provides a system for facilitating enhanced compression of a CSS file. The system compresses the CSS file by merging the repeated selectors (e.g., multiple declaration of the same selector) and removing the repeated properties in the same selector. The system then removes the overwritten style statement in the same selector (e.g., overwritten value of a property) and aggregates the selectors that includes the same properties. The system further extracts and merges the common factors. It should be noted that these five steps can be sequential since a respective step should be performed based on the previous one.

Figure 1A:
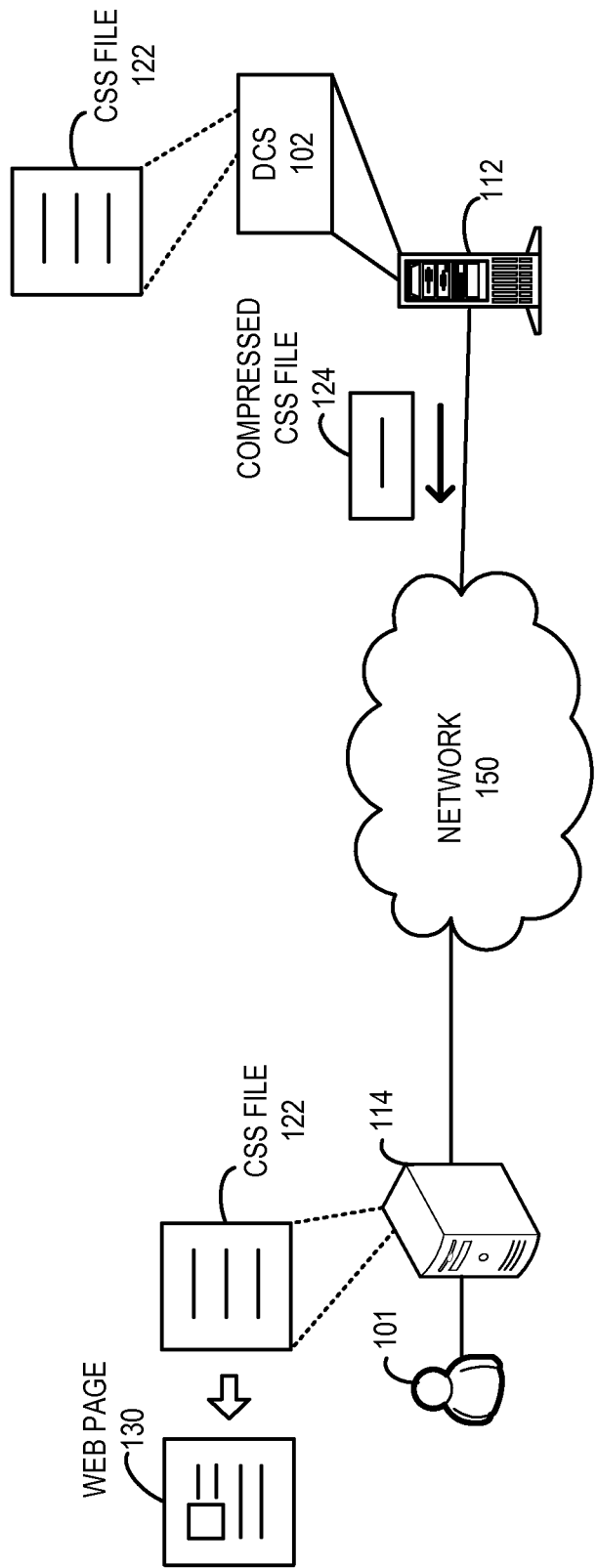
FIG. 1A illustrates an exemplary compressed CSS file transmission across a network, in accordance with an embodiment of the present application.

FIG. 1A illustrates an exemplary compressed CSS file transmission across a network, in accordance with an embodiment of the present application. In this example, a data compression system 102 for CSS file compression is deployed in server 112 for enhanced compression of CSS file 122 at server 112. Server 112 can store the CSS file in a local storage device. Suppose that CSS file 122 is sent over a network 150 (e.g., a local area network (LAN), a wide area network (WAN), the Internet), along with a web page 130 to provide the presentation style for web page 130 in a browser in a client device 114. The presentation style dictates how web page 130 is presented to user 101 in the browser.

With existing technologies, a compression technique is applied on CSS file 122 prior to transmission over network 150. Typically, compressing CSS file 122 includes removing the margins, annotations, repeated and invalid characters in CSS file 122. However, such compression does not significantly reduce redundancy within and across the selectors of CSS file 122. Transmitting CSS file 122 across network 150 thus becomes inefficient. To solve this problem, system 102 compresses CSS file 122 to generate a compressed CSS file 124. In some embodiments, system 102 prepares the CSS file for compression by organizing the properties of all selectors in an alphabetic order. Server 112 also stores the compressed CSS file 124 in a local storage device. Whenever client device 114 requests for web page 130, server 112 transmits compressed CSS file 124 over network 150 to client device 114.

Figure 1B:
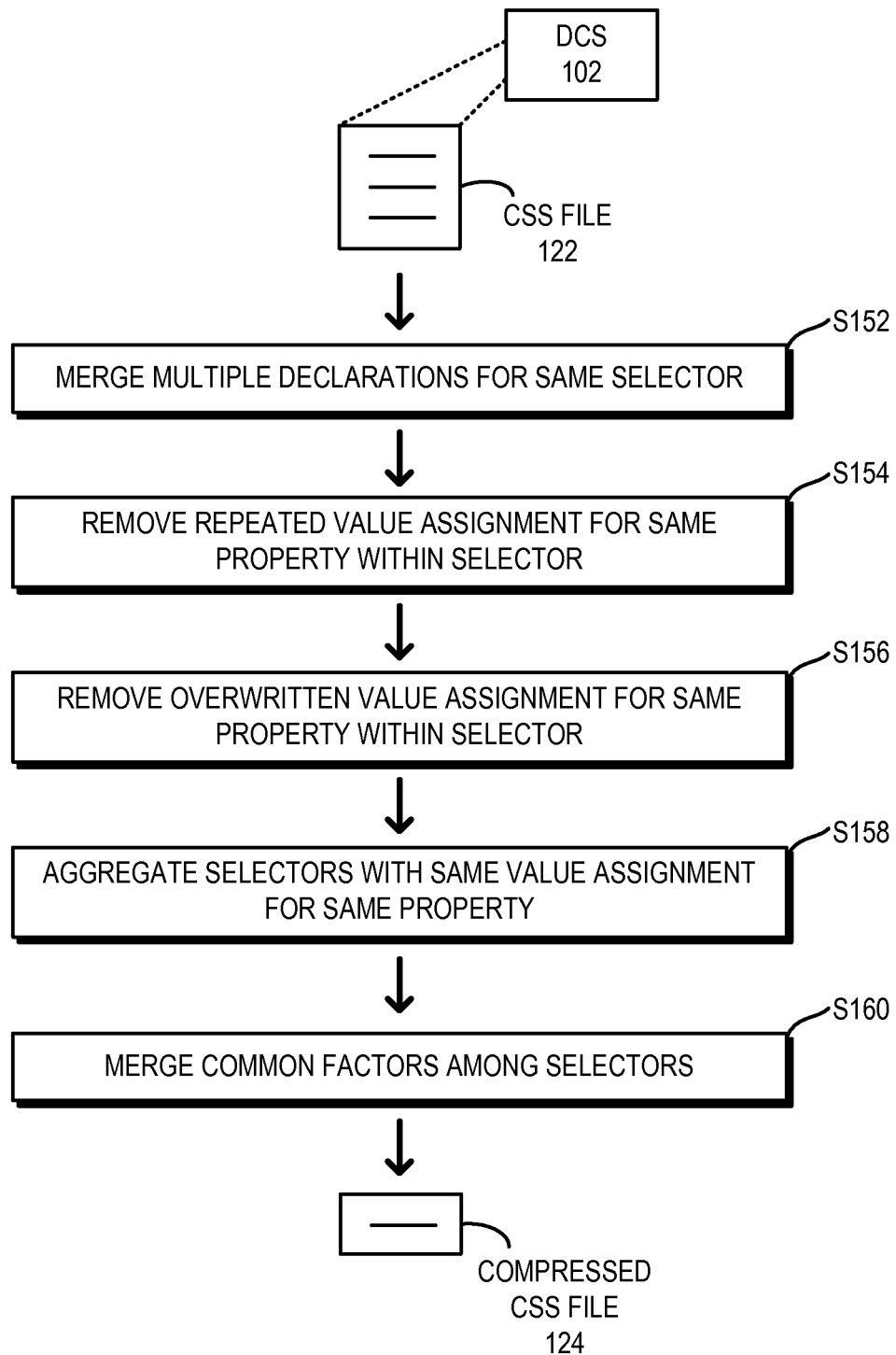
FIG. 1B illustrates an exemplary enhanced CSS file compression process, in accordance with an embodiment of the present application.

FIG. 1B illustrates an exemplary enhanced CSS file compression process, in accordance with an embodiment of the present application. System 102 generates compressed CSS file 124 based on a number of steps. During the enhanced compression process, system 102 merges the repeated selectors (operation S152). For example, the selectors in .a{margin:0}.a{padding:0} are the same. Hence, they can be merged as .a{margin:0;padding:0}. System 102 also removes the repeated value assignments for the same property in the same selector (operation S154). Since the value of the property "margin" is repeated in .a{margin:0;margin:1px}, system 102 can compress it as .a{margin:1px}. System 102 then removes the overwritten value assignment for the same property within the same selector (operation S156) (e.g., overwritten value of a property). For example, since "background" also includes "background-color," .a{background-colon#FFF; background:#000 url(xxx.jpg)} can be compressed as .a{background:#000 url(xxx.jpg)}.

System 102 aggregates the selectors that include the same value assignment for the same properties (operation S158). Properties "margin" and "color" have the same values in .a{margin:0;color:#000}.b{margin:0;color:#000}. Hence, selectors .a and .b can be merged as .a,.b{margin;0;color:#000}. System 102 further extracts and merges the common factors in CSS file 122 (operation S160). For example, system 102 can extract common factor margin from .a{margin:0;padding:0}.b{margin:0;padding:1} and merge them as .a,.b{margin:0}.a{padding:0}.b{padding:1}. In this way, system 102 generates compressed CSS file 124.

Figure 2A:
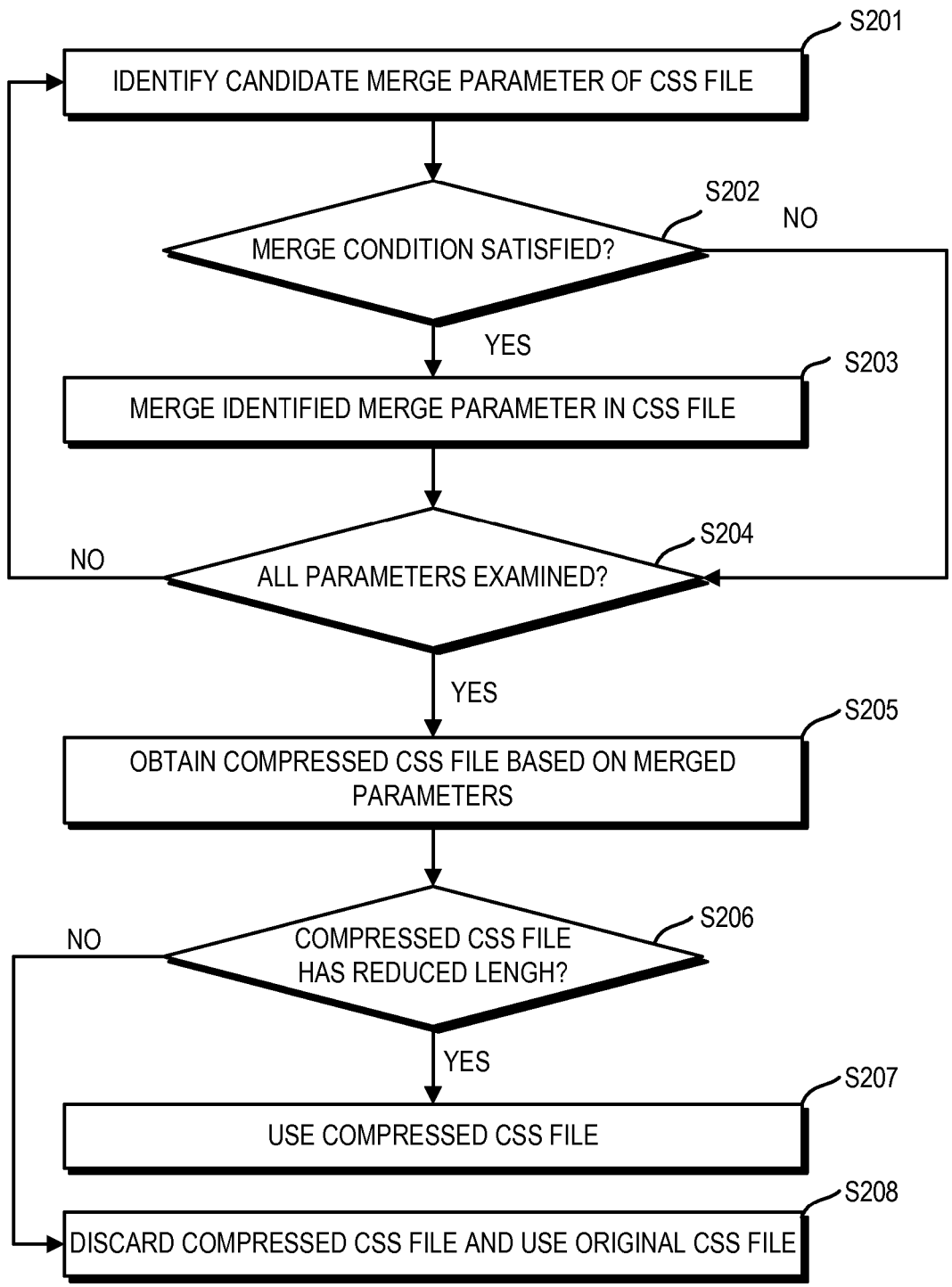
FIG. 2A presents a flowchart illustrating an enhanced CSS file compression process of a data compression system, in accordance with an embodiment of the present application.

FIG. 2A presents a flowchart illustrating an enhanced CSS file compression process of a data compression system, in accordance with an embodiment of the present application. During operation, the system identifies a candidate merge parameter of the CSS file (operation S201). The CSS file can be any original CSS file that has not been compressed. The CSS file can also be a compressed CSS file, which has been compressed using the conventional compression methods (e.g., the margins, annotation characters, invalid and repeated characters may have been removed). In operation S201, the system determines the parameter that can be merged in the CSS file. The parameter is the element that has been repeatedly present in the CSS file.

The parameter can be a repeated selector, a repeated property in a selector, or the same value of a property in different selectors. For example, .a{margin:0}.b{padding:0}.a{padding:0} includes the repeated selector .a. Hence, selector .a can be identified as a candidate merge parameter. On the other hand, .a{margin:0;margin:1px} includes a repeated property "margin" in selector .a. Furthermore, .a{margin:0;padding:0}.b{margin:0;padding:1} includes the same value 0 for property "margin" in selectors .a and .b. Similarly, .a{margin:0;padding:0;colon#FFF; padding:1}.b {margin:0;padding:1}.a{margin:0;padding:1; color:#FFF} includes the same selector .a, which includes the same property "padding," and selectors .a and .b include the same values 0 and 1 for properties "margin" and "padding," respectively.

The system then checks whether a merge condition has been satisfied (operation S202). The merge condition is used to determine whether the merging of the merge parameter is consistent with the original style (i.e., the original values of the properties) in the original CSS file. If it is consistent, the merge condition is satisfied. If the merge condition is satisfied, the system merges the identified merge parameter in the CSS file (operation S203) and checks whether all parameters have been examined (operation S204). If the merge condition is not satisfied, the system checks whether all parameters have been examined as well (operation S204). If all parameters have not been examined, the system continues to identify a candidate merge parameter of the CSS file (operation S201). In some embodiments, the system can also check whether the length of the merged selector(s)

are longer or not. If so, the system can discard the merger. For example, if the selectors are merged in .aaaaaaaaa{margin:0;padding:0}.bbbbbbbbbb{margin:0; padding:1}, the obtained selector has a longer name: .aaaaaaaaa,.bbbbbbbbbb{margin:0}.aaaaaaaaa{padding: 0}.bbbbbbbbbb{padding:1}.

Since the length is longer, the system discards the merger.

If all parameters have been examined, the system obtains the compressed CSS file based on the merged parameters (operation S205). The system then checks whether the compressed CSS file has a reduced file length than the original CSS file (operation S206). If the compressed CSS file has a reduced file length, the system uses the compressed CSS file (operation S207). Otherwise, the system discards the compressed CSS file and uses the original CSS file (operation S208). It should be noted that, if the system checks the length after a respective merging operation, the compressed CSS file may not have a larger file size.

Figure 2B:
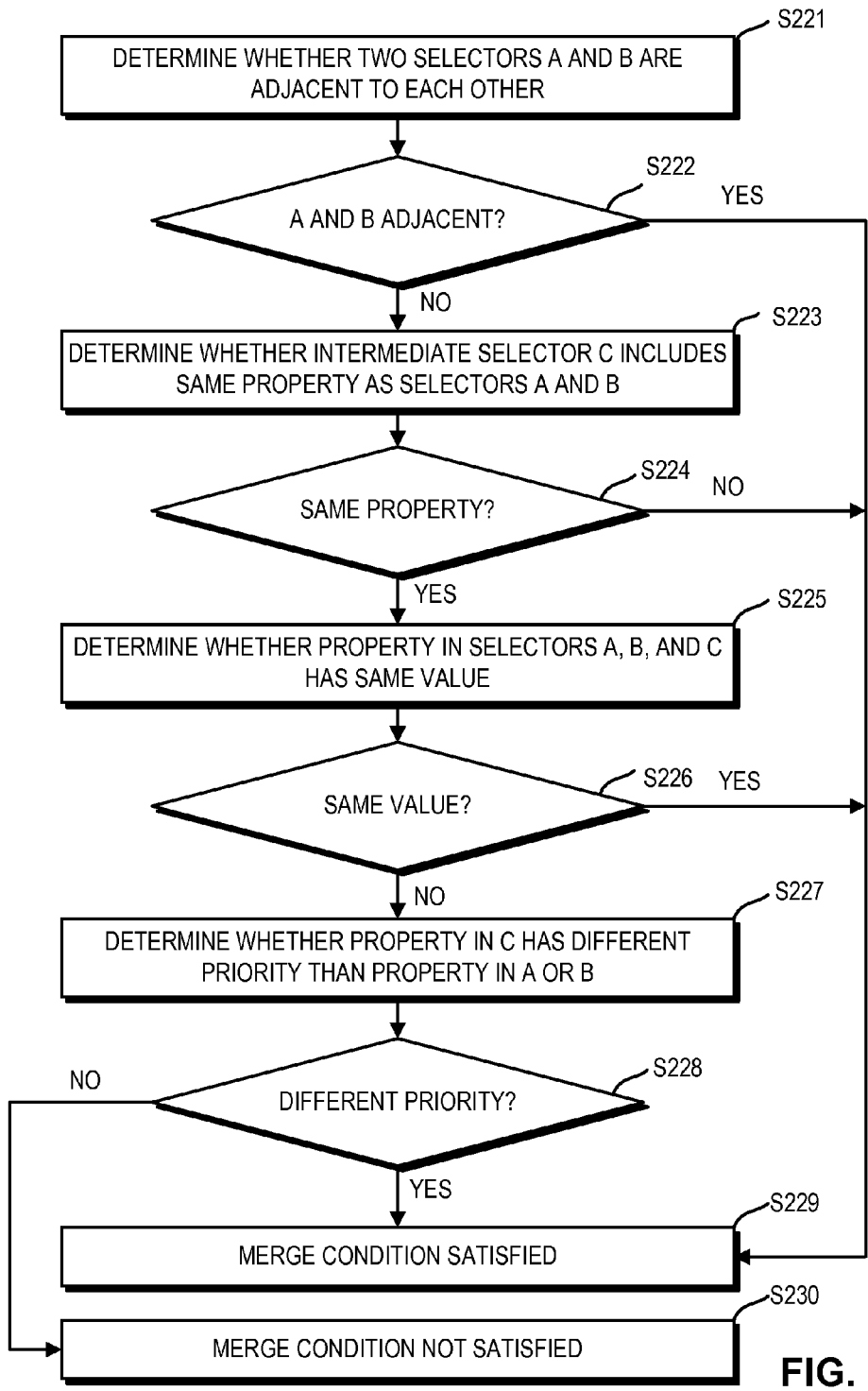
FIG. 2B presents a flowchart illustrating a validation process of a data compression system for the enhanced CSS file compression, in accordance with an embodiment of the present application.

FIG. 2B presents a flowchart illustrating a validation process of a data compression system for the enhanced CSS file compression, in accordance with an embodiment of the present application. The validation process determines whether the merge condition for a candidate merge parameter is satisfied. The system determines whether two selectors A and B are adjacent to each other (operation S221). For example, in .a{margin:0}.a{padding:0}, the two selectors are adjacent to each other. On the other hand, in .a{margin:0}.b{padding:1px}.a{padding:0}, selectors .a are not adjacent to each other.

If A and B are not adjacent (operation S222), the system determines whether an intermediate selector C includes the same property as selectors A and B (operation S223). If a property included in intermediate selector C is different from the properties of selectors A and B, the merging of selectors A and B may not affect the property of selector C, and the merge condition is satisfied. If selector C includes a property which is included in selector A but is not included in selector B, merging selector B with selector A may not affect intermediate selector C. Similarly, if selector C includes a property which is included in selector B but is not included in selector A, merging selector A with selector B may not affect intermediate selector C. Under these two circumstances, the merge condition is satisfied.

If the selectors have the same property (operation S224), the system checks whether the property in selectors A, B, and C have the same value (operation S225). If the property does not have the same value (operation S226), the system checks whether the property has a different priority in selector C than selectors A and B (operation S227). If the property does not have a different priority (operation S228), the system determines that the merge condition has not been satisfied (operation S230). If selectors A and B are adjacent (operation S222), selector C does not have the same property as selectors A and B (operation S224), the property in selectors A, B, and C has the same value (operation S226), or the property in selector C has a different priority (operation S228), the system determines that the merge condition has been satisfied (operation S230).

For example, in .a{margin:0;padding:1}.b{padding:1px}.a{padding:0}, a respective selector includes the property "padding," but the values are different. Hence, the system determines that the merge condition has not been satisfied. On the other hand, in .a{margin:0;padding:1}.b{padding:1px !important}.a{padding:0}, .a{margin:0;padding:1}.b{padding:1px}.a {padding:0 !important}, or .a{margin:0;padding:1 !important}.b{padding:1px}.a{padding:0}, the property "padding" in the intermediate selector has a different priority. Hence, the system determines that the merge condition has been satisfied.

Figure 2C:
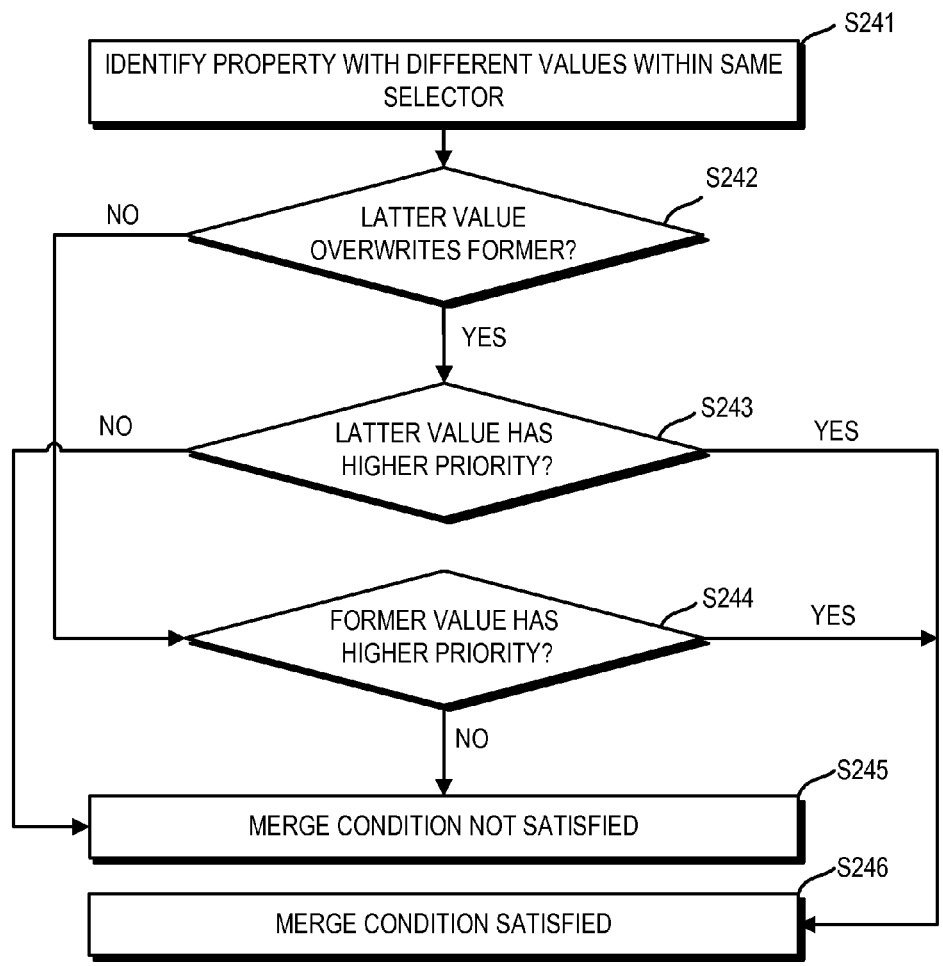
FIG. 2C presents a flowchart illustrating an overwrite validation process of a data compression system for the enhanced CSS file compression, in accordance with an embodiment of the present application.

In CSS file 122, if the values of the same property have the same priority, the latter value overwrites the former value to obtain the compressed CSS file. If the values of the property have different priorities, the value with a higher priority overwrites the value with a lower priority to obtain the compressed CSS file. FIG. 2C presents a flowchart illustrating an overwrite validation process of a data compression system for the enhanced CSS file compression, in accordance with an embodiment of the present application. During operation, the system identifies a property with different values within the same selector (operation S241).

The system then checks whether the latter value overwrites the former (operation S242). If so, the system checks whether the latter value has a higher priority (operation S243). Otherwise, the system checks whether the former value has a higher priority (operation S244). If the latter value overwrites the former value and has a higher priority, the system determines that the merge condition has been satisfied (operation S246). Similarly, if the former value overwrites the latter and has a higher priority, the system determines that the merge condition has been satisfied (operation S246). Otherwise, the system determines that the merge condition has not been satisfied (operation S245).

It should be noted that, when there is no relation of overwriting among the properties in the same selector, the merge condition is satisfied. Otherwise, if the values of the property have the same priority, the latter value may directly overwrite the former value. For example, .a{margin:0; margin:1px} may be directly merged as .a{margin:1px}. Here, .a{margin:1px} can be considered as a compressed merge parameter. If the values of the same property have different priorities, the value with a higher priority overwrites the value with a lower priority. For example, .a{margin:0 !important;margin:1px} is merged as .a {margin:0 !important}, or .a{margin:0;margin:1px !important} is merged as .a{margin:1px !important}.

If the latter value overwrites the former value, and the latter value has the same or a higher priority over the former value, the merge condition is satisfied. In this case, the latter value overwrites the former one for merging. For example, .a{background-color:#FFF;background:#000 url (xxx.jpg)} is merged as .a{background:#000 url(xxx.jpg)}. On the other hand, if the former value overwrites the latter value, and the former value has a higher priority over the latter value, the merge condition is satisfied. In this case, the former value with the higher priority overwrites the latter value. For example, .a{background:#000 url(xxx.jpg) !important; background-color:#FFF} is merged as .a{background:#000 url(xxx.jpg) !important}.

In some scenarios, the merging decision can be complex. For example, in .a{margin:0;padding:0;colon#FFF}.b {margin:0;padding:1;colon#FFF}.c{margin:0;padding:1;color: #000}, each of the three selectors have the same properties with both same and different values. If all possibilities are traversed and all results are calculated to compare the respective lengths, the shortest merged selectors can be selected. However, if there are n selectors and m properties, there are n!m! possibilities. Such extensive computation may not be feasible in practice. To solve this problem, embodiments of the present invention provides a graphic selection algorithm for the selection of common factors.

Figure 3A:
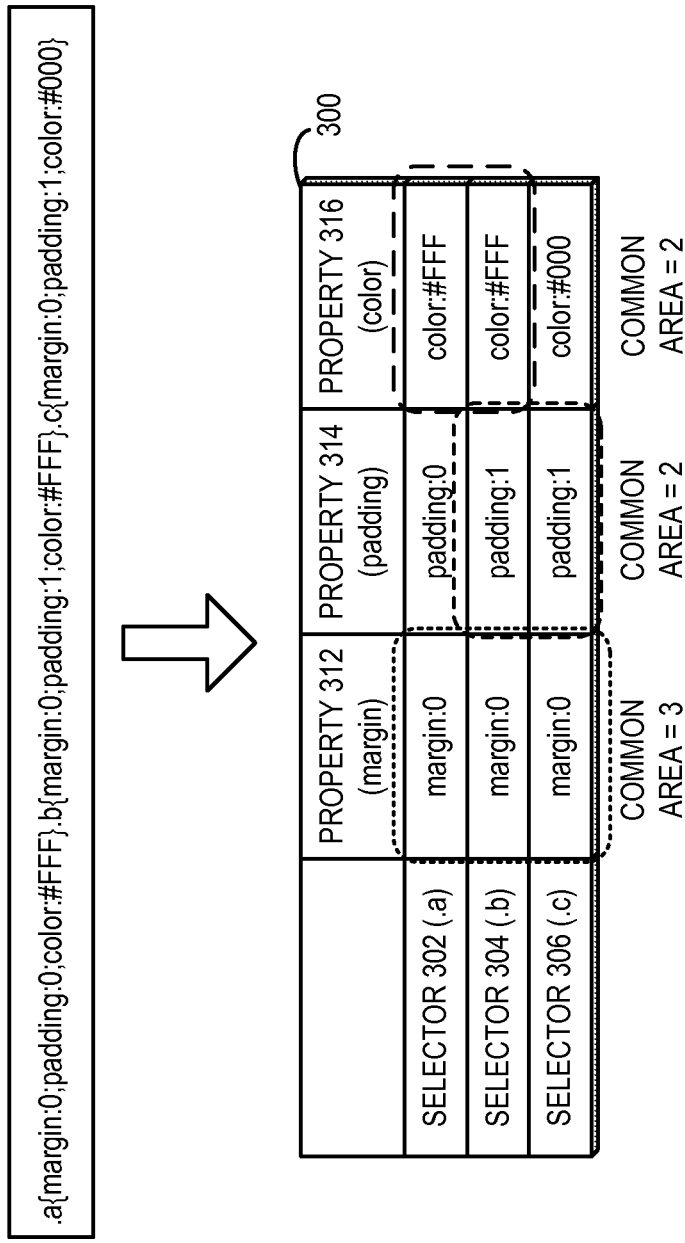
FIG. 3A illustrates an exemplary graphical selection of common factors for the enhanced CSS file compression, in accordance with an embodiment of the present application.

FIG. 3A illustrates an exemplary graphical selection of common factors for the enhanced CSS file compression, in accordance with an embodiment of the present application. Suppose that there are n selectors 302, 304, and 306 (e.g., selectors .a, .b, and .c, respectively) and m properties 312, 314, and 316 (e.g., properties "margin," "padding," "color," respectively). The graphical selection algorithm generates a two-dimensional table 300 with n row and m columns. During operation, the system first selects the property that maximizes merging. In other words, the system selects a property that maximizes the common area (e.g., the number of grids with the same value for a property) in table 300.

In table 300, the values of property 312 are the same for a respective selector. Hence, the number of grids that can be merged for property 312 is 3. The system thus determines the common area for property 312 to be 3. In the same way, the system determines the common area for properties 314 and 316 to be 2 and 2, respectively. During the graphical selection process using table 300, the system first selects the column for which the common area is 3 and extracts the corresponding common factor (i.e., the corresponding property). The system merges the common factor for a respective selector. In the example in FIG. 3A, extracting and merging common factor "margin" yields .a,.b,.c{margin:0}.

The system then selects and merges the column for which the common area is 2. Since two columns have the same common area, either one can be selected (e.g., random selection) for merging. Once a set of grids in table 300 are merged, those grids are excluded in further calculation. It should be noted that the merger of the grids require validation, as described in conjunction with FIG. 2B. After the merger, if the length for the common factor has not reduced, the extraction is not performed for the common factor. In the example in FIG. 3A, extracting and merging the common factors using the graphical selection algorithm yields a,.b,.c{margin:0}.a,.b{color:#FFF}.a{padding:0}.b,.c{padding:1}.c{color:#000}. Here, the length is reduced by 21 characters.

Figure 3B:
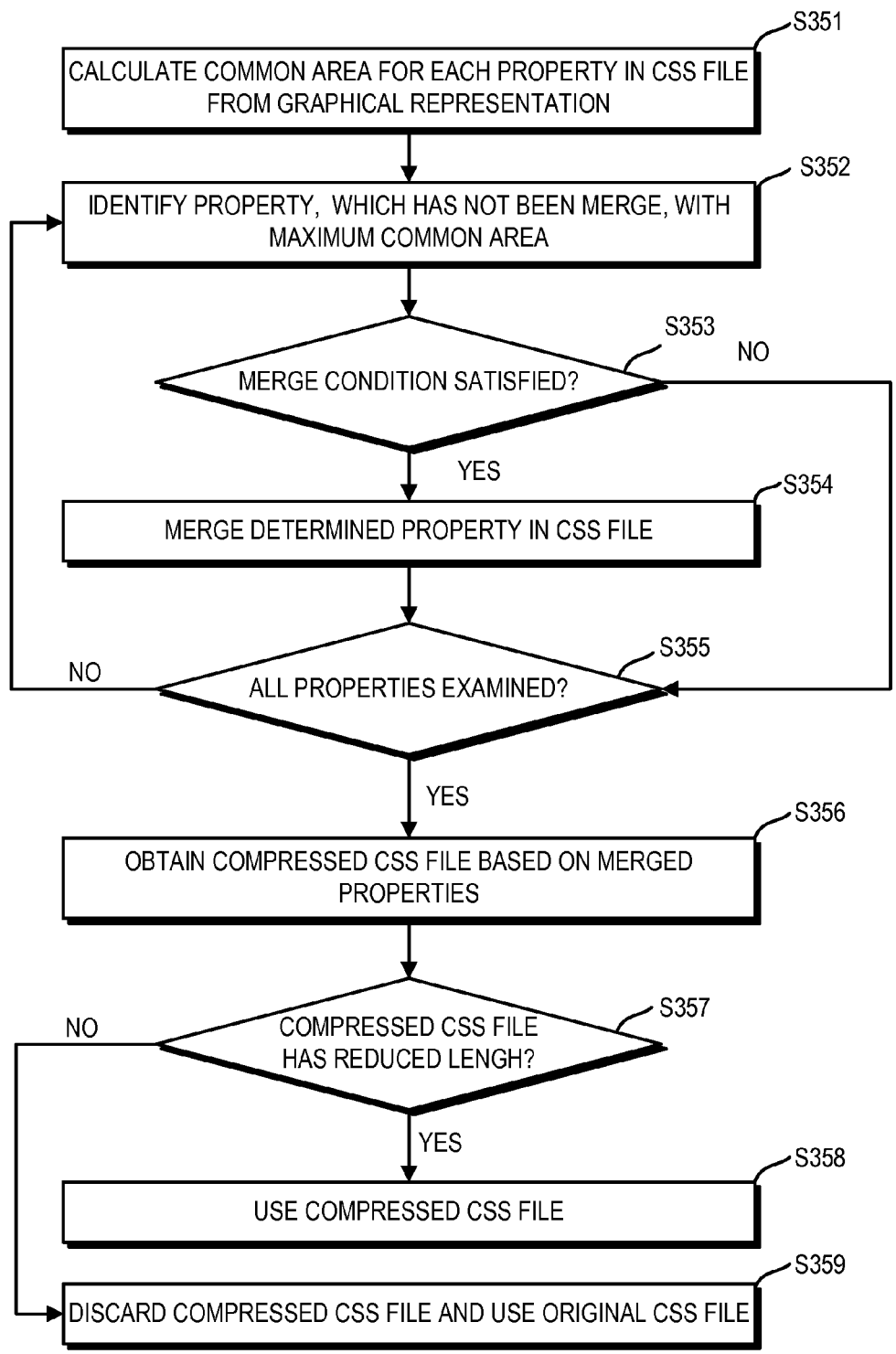
FIG. 3B presents a flowchart illustrating an enhanced CSS file compression process of a data compression system based on common factors, in accordance with an embodiment of the present application.

FIG. 3B presents a flowchart illustrating an enhanced CSS file compression process of a data compression system based on common factors, in accordance with an embodiment of the present application. During operation, the system calculates the common area for each property in the CSS file from a graphical representation (e.g., a table), as described in conjunction with FIG. 3A (operation S351). The system identifies the property, which has not been merged, with the maximum common area (operation S352). The system then checks whether a merge condition has been satisfied (operation S353). The merge condition is used to determine whether the merging of the merge parameters is consistent with the original style. If they are consistent, the merge condition is satisfied. In some embodiments, the merge condition can also include reduction of length upon merging.

If the merge condition is satisfied, the system merges the identified property in the CSS file (operation S354) and checks whether all properties of the graphical representation have been examined (operation S355). If the merge condition is not satisfied, the system checks whether all properties have been examined (operation S355). If all properties have not been examined, the system continues to the next property with the maximum common area (operation S352). If all properties have been examined, the system obtains the compressed CSS file based on the merged properties (operation S356). The system then checks whether the compressed CSS file has a reduced file length than the original CSS file (operation S357). If the compressed CSS file has a reduced file length, the system uses the compressed CSS file (operation S358). Otherwise, the system discards the compressed CSS file and uses the original CSS file (operation S359).

Figure 4:
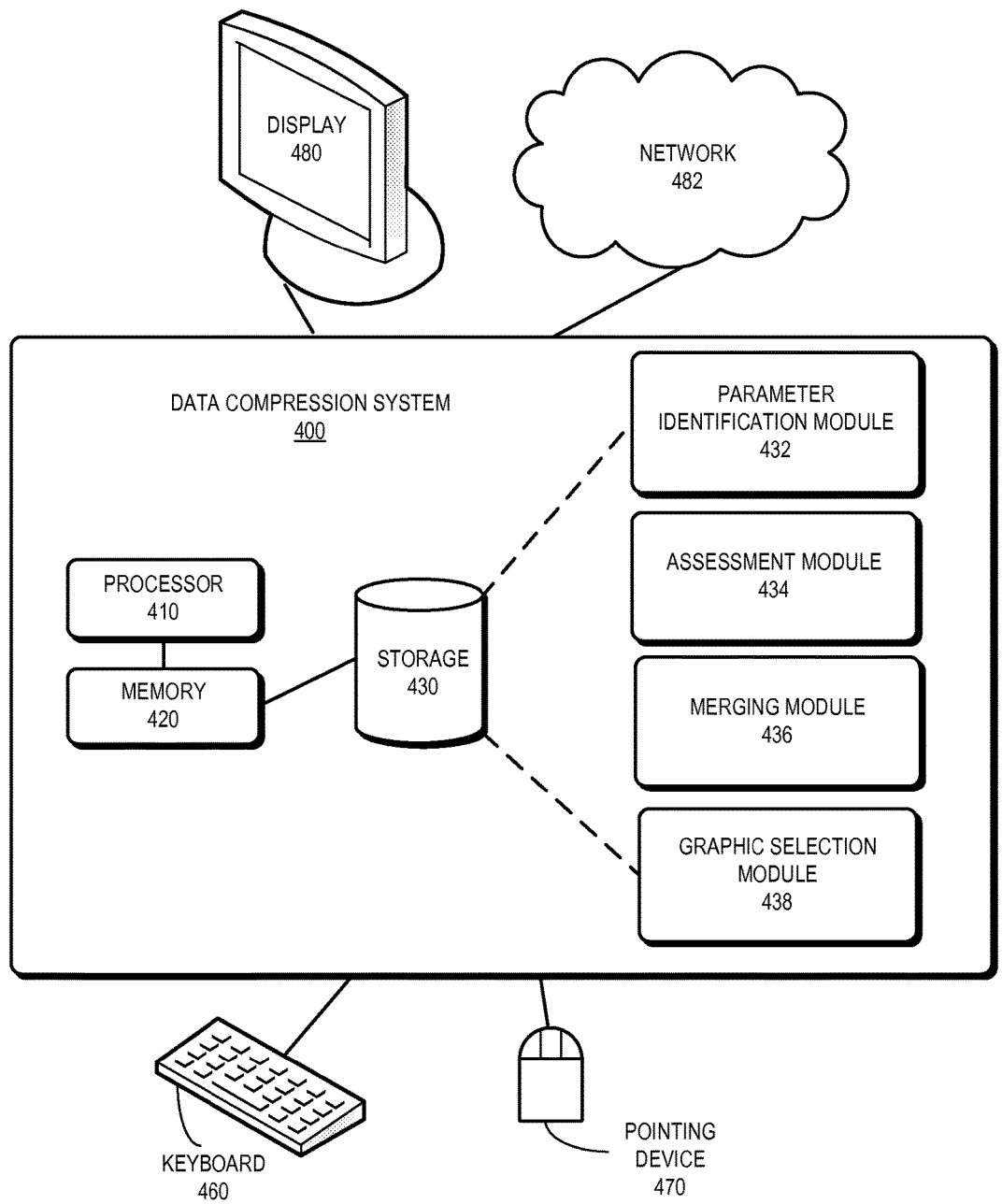
FIG. 4 is a schematic structural diagram of an exemplary data compression system, in accordance with an embodiment of the present application.

FIG. 4 is a schematic structural diagram of an exemplary data compression system, in accordance with an embodiment of the present application. A data compression system 400 can be used for compressing a CSS file. System 400 includes a processor 410, a memory 420, and a storage device 430. Storage device 430 typically stores instructions that can be loaded into memory 420 and executed by processor 410 to perform the methods described above. In one embodiment, the instructions in storage 430 can implement a parameter identification module 432, an assessment module 434, a merging module 436, and a graphic selection module 438, all of which can communication with each other through various means.

In some embodiments, modules 432, 434, 436, and 438 can be partially or entirely implemented in hardware and can be part of processor 410. Further, in some embodiments, the system may not include a separate processor and memory. Instead, in addition to performing their specific tasks, modules 432, 434, 436, and 438, either separately or in concert, may be part of special-purpose computation engines.

Storage 430 stores programs to be executed by processor 410. Specifically, storage 430 stores a program that implements a system (application) for enhanced compression of a CSS file. During operation, the application program can be loaded from storage 430 into memory 420 and executed by processor 410. As a result, system 400 can perform the functions described above. System 400 can be further coupled to an optional display 480, a keyboard 460, and a pointing device 470, and can be coupled via one or more network interfaces to a network 482.

During operation, property identification module 432 determines a merge parameter of a CSS file, as described in conjunction with FIG. 2A. The merge parameter can include a selector, a property, and values assigned to different properties. Assessment module 434 determines whether the determined merge parameter satisfies a merge condition. Merging module 436 merges the merge parameters in the CSS file to obtain a compressed CSS file. In some embodiments, graphic selection module 438 represents the properties in the CSS file in a graphical representation (e.g., in a table), and extracts and merges the common factors of the CSS file based on the graphical representation, as described in conjunction with FIG. 3B.

The data structures and computer instructions described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

The above description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

What is claimed is:

1. A method for facilitating compression of a Cascading Style Sheet (CSS) file, the method comprising:
    identifying, by a server hosting a web page associated with the CSS file, a first selector and a second selector in the CSS file by identifying a repeated code in the first and second selectors, wherein the repeated code appears in each of the first and second selectors;
    determining whether the first selector and the second selector are adjacent in the CSS file;
    in response to the first and second selectors not being adjacent, determining whether a third selector between the first and second selectors includes a property included in the first and second selectors;
    in response to the third selector not including the property, determining that merging the repeated code in the first and second selectors produces a same style for the web page as the original style in the CSS file;
    merging the repeated code in the first and second selectors in the CSS file to obtain a compressed CSS file;
    receiving a request for the web page; and
    in response to receiving the request for the web page, generating a web response comprising the web page and the compressed CSS file.

2. The method of claim 1, further comprising determining whether the compressed CSS file is valid based on a length of the merged repeated code.

3. The method of claim 1, wherein in response to the third selector including the property, the method further comprises determining whether the repeated code includes one or more of:
    a same value in the first, second, and third selectors;
    different priorities in the first, second, and third selectors.

4. The method of claim 1, further comprising determining that merging the repeated code in the first and second selectors produces a same style for the web page as the original style in the CSS file further in response to determining that:
    a latter value of a property of the repeated code overwrites a former value of the property and the latter value has an equal or higher priority; or
    a former value of the property overwrites a latter value of the property and the former value has a higher priority.

5. The method of claim 1, wherein merging the repeated code comprises removing a second value of a property, wherein the second value appears before a first value, has a lower priority than the first value, or has an overwriting relationship with the first value.

6. The method of claim 1, further comprising:
    representing selectors of the CSS file and corresponding properties in a table; and
    determining a common area in the table for a respective property.

7. The method of claim 6, further comprising:
    identifying a current maximum common area in the table for a property;
    extracting the property as a common factor;
    merging the common factor across a respective selector comprising the property.

8. The method of claim 1, further comprising generating the compressed CSS file based on a plurality of merged repeated codes.

9. The method of claim 1, further comprising, prior to generating the compressed CSS file, organizing properties of all selectors in the CSS file in an alphabetic order.

10. A non-transitory storage medium storing instructions, which when executed by a processor cause the processor to perform a method for facilitating compression of a Cascading Style Sheet (CSS) file, the method comprising:
    identifying, by a server hosting a web page associated with the CSS file, a first selector and a second selector in the CSS file by identifying a repeated code in the first and second selectors, wherein the repeated code appears in each of the first and second selectors;
    determining whether the first selector and the second selector are adjacent in the CSS file;
    in response to the first and second selectors not being adjacent, determining whether a third selector between the first and second selectors includes a property included in the first and second selectors;
    in response to the third selector not including the property, determining that merging the repeated code in the first and second selectors produces a same style for the web page as the original style in the CSS file; and
    merging the repeated code in the first and second selectors in the CSS file to obtain a compressed CSS file;
    receiving a request for the web page; and
    in response to receiving the request for the web page, generating a web response comprising the web page and the compressed CSS file.

11. The non-transitory storage medium of claim 10, wherein the method further comprises determining whether the compressed CSS file is valid based on a length of the merged repeated code.

12. The non-transitory storage medium of claim 10, wherein in response to the third selector including the property, the method further comprises determining whether the repeated code includes one or more of:
    a same value in the first, second, and third selectors;
    different priorities in the first, second, and third selectors.

13. The non-transitory storage medium of claim 10, wherein the method further comprises determining that merging the repeated code in the first and second selectors produces a same style for the web page as the original style in the CSS file further in response to determining that:
    a latter value of a property of the repeated code overwrites a former value of the property and the latter value has an equal or higher priority; or
    a former value of the property overwrites a latter value of the property and the former value has a higher priority.

14. The non-transitory storage medium of claim 10, wherein merging the repeated code comprises removing a second value of a property, wherein the second value appears before a first value, has a lower priority than the first value, or has an overwriting relationship with the first value.

15. The non-transitory storage medium of claim 10, wherein the method further comprises:
   representing selectors of the CSS file and corresponding properties in a table; and
   determining a common area in the table for a respective property.

16. The non-transitory storage medium of claim 15, wherein the method further comprises:
   identifying a current maximum common area in the table for a property;
   extracting the property as a common factor;
   merging the common factor across a respective selector comprising the property.

17. The non-transitory storage medium of claim 10, wherein the method further comprises generating the compressed CSS file based on a plurality of merged repeated codes.

18. The non-transitory storage medium of claim 10, wherein the method further comprises, prior to generating the compressed CSS file, organizing properties of all selectors in the CSS file in an alphabetic order.

19. A computing system for facilitating compression of a Cascading Style Sheet (CSS) file and hosting a web page associated with the CSS file, the computing system comprising:
   a processor;
   a memory coupled to the processor and storing instructions, which when executed by the processor cause the processor to perform a method, the method comprising:
   identifying a first selector and a second selector in the CSS file by identifying a repeated code in the first and second selectors, wherein the repeated code appears in each of the first and second selectors;
   determining whether the first selector and the second selector are adjacent in the CSS file;
   in response to the first and second selectors not being adjacent, determining whether a third selector between the first and second selectors includes a property included in the first and second selectors;
   in response to the third selector not including the property, determining that merging the repeated code in the first and second selectors produces a same style for the web page as the original style in the CSS file;
   merging the repeated code in the first and second selectors in the CSS file to obtain a compressed CSS file;
   receiving a request for the web page; and
   in response to receiving the request for the web page, generating a web response comprising the web page and the compressed CSS file.

* * * * *